(12) United States Patent
Kawachi et al.

(10) Patent No.: US 7,176,599 B2
(45) Date of Patent: Feb. 13, 2007

(54) SURFACE ACOUSTIC WAVE DEVICE AND METHOD OF PRODUCING THE SAME

(75) Inventors: Osamu Kawachi, Yokohama (JP); Yoshiro Fujiwara, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 10/860,248

(22) Filed: Jun. 4, 2004

(65) Prior Publication Data
US 2004/0245891 A1    Dec. 9, 2004

(30) Foreign Application Priority Data
Jun. 5, 2003    (JP)    ............... 2003-161119

(51) Int. Cl.
*H03H 9/25*    (2006.01)
(52) U.S. Cl. ............... 310/313 R; 310/313 B
(58) Field of Classification Search ............ 310/313
See application file for complete search history.

(56) References Cited

U.S. PATENT DOCUMENTS

| 4,737,742 A * | 4/1988 | Takoshima et al. ......... 310/348 |
| 5,393,444 A | 2/1995 | Asai et al. |
| 2002/0043891 A1 * | 4/2002 | Takahashi et al. ...... 310/313 D |

FOREIGN PATENT DOCUMENTS

| JP | 1-005998 | 1/1989 |
| JP | 8-18390 | 1/1996 |
| JP | 11-92147 | 4/1999 |
| JP | 2001-110946 | 4/2001 |
| JP | 2004-364041 | 12/2004 |

* cited by examiner

*Primary Examiner*—Darren Schuberg
*Assistant Examiner*—J. Aguirrechea
(74) *Attorney, Agent, or Firm*—Arent Fox PLLC

(57) ABSTRACT

A surface acoustic wave device includes: interdigital transducers; first electrode pads that are connected to the interdigital transducers through wire patterns; and a piezoelectric substrate on which the interdigital transducers, the first electrode pads, and the wire patterns, are formed. In this surface acoustic wave device, at least one of the first electrode pads is not connected to a ground pattern, and the piezoelectric substrate has a conductivity in the range of $10^{-12}/\Omega \cdot cm$ to $10^{-6}/\Omega \cdot cm$.

3 Claims, 19 Drawing Sheets

Ar ATOMS

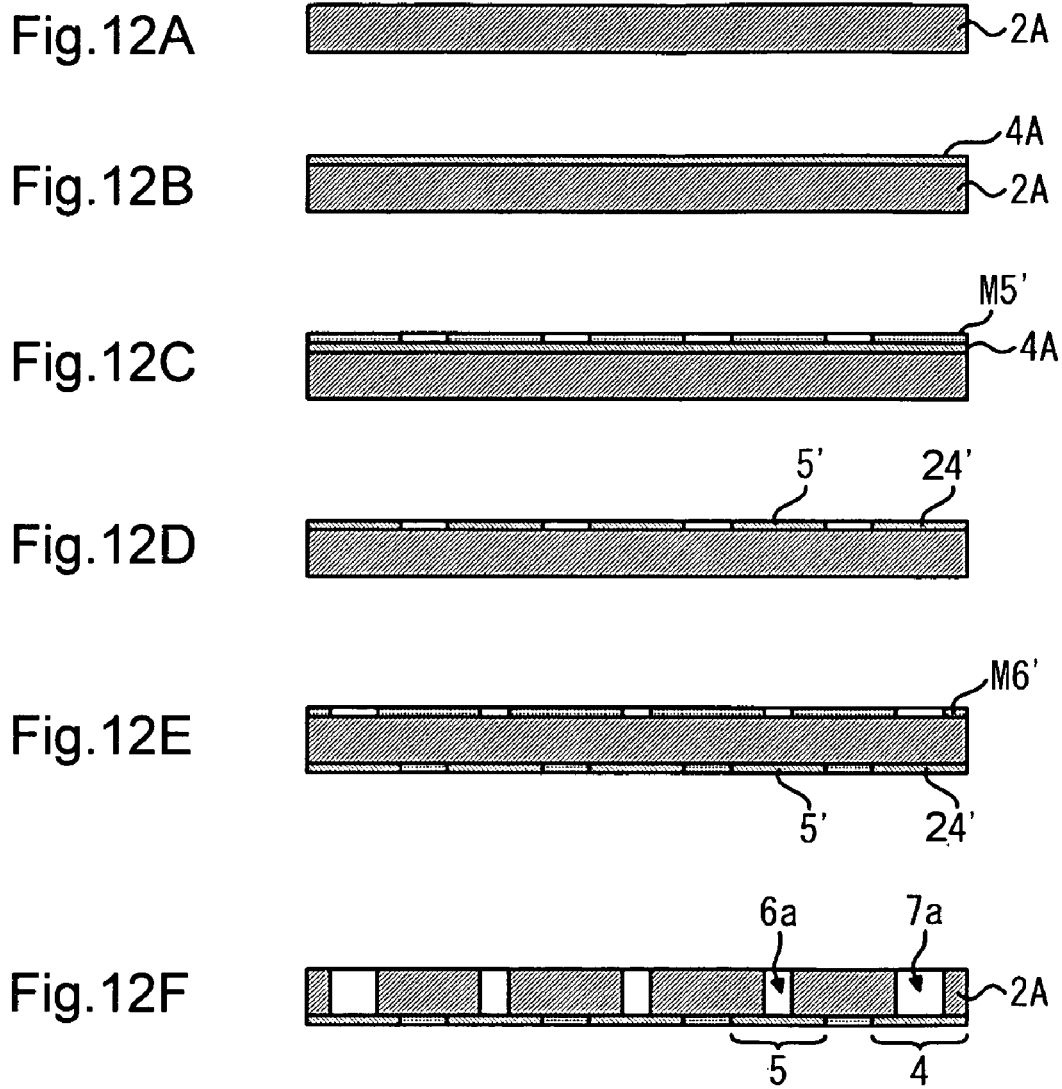

SURFACE ACOUSTIC WAVE DEVICE AND METHOD OF PRODUCING THE SAME

BACKGROUND OF THE INVENTION

1. Field of the Invention

The present invention generally relates to a surface acoustic wave device and a method of producing the surface acoustic wave device, and more particularly, to a surface acoustic wave device having a surface acoustic wave element sealed therein and a method of producing the surface acoustic wave device.

2. Description of the Related Art

As electronic apparatuses with higher performances have become smaller in size, electronic devices to be mounted to such apparatuses are also expected to be smaller and have higher performances. Especially, surface acoustic wave (SAW) devices to be used as electronic parts such as filters, delay lines, and oscillators for electronic apparatuses that transmit or receive electric waves, are employed in the radio frequency (RF) units of cellular phones and communication devices, so as to restrict undesired signal transmission and reception. As cellular phones and communication devices with ever higher performances are rapidly becoming smaller, those SAW devices are expected to be smaller in package size and have higher performances. Furthermore, as there is a rapidly increasing demand for SAW devices that can be used in more various fields, the production costs are expected to be lower.

FIGS. 1A and 1B illustrate a SAW device 100 that employs a conventional SAW element. Such a SAW device is disclosed in Japanese Unexamined Patent Publication No. 8-18390, particularly, in FIG. 4 of the publication. FIG. 1A is a perspective view of the SAW device 100. FIG. 1B is a section view of the SAW device 100, taken along the line F—F, of FIG. 1A.

As shown in FIG. 1A, the SAW device 100 includes a package 102 made of ceramics, a metal cap 103 that seals the opening of a cavity 109 formed in the package 102, and a SAW element 110 that is mounted in the cavity 109. As shown in FIG. 1B, the package 102 has a three-layer structure in which three substrates 102a, 102b, and 102c are laminated. Electrode pads 105, wire patterns 106, and foot patterns 107 are formed on the three substrates 102a, 102b, and 102c, respectively. The SAW element 110 has comb-like electrode or interdigital transducers (IDTs) on a first principal surface (the upper surface) of a piezoelectric substrate 111. The piezoelectric substrate 111 has a second principal surface fixed onto the bottom surface of the cavity 109. The second principal surface is the opposite surface of the piezoelectric substrate 111 from the first principal surface. In short, the SAW element 110 is face-up mounted in the cavity 109. Electrode pads 114 formed on the SAW element 110 are electrically connected to the electrode pads 105, which are exposed to the inside of the cavity 109, through metal wires 108. In other words, the SAW element 110 is connected to the package 102 by wire-bonding. The metal cap 103 is fixed onto the upper surface of the package 102 with a joining material such as solder or resin (a washer 104), so that the cavity 109 can be hermetically sealed.

Also, a small-sized SAW device can be realized by flip-chip mounting a SAW element in a face-down state on a die-attach surface. Japanese Unexamined Patent Publication No. 2001-110946 discloses such a technique. FIGS. 2A and 2B illustrate a SAW device 200. FIG. 2A is a perspective view of a SAW element 210 to be mounted on the die-attach surface. FIG. 2B is a section view of the SAW device 200, taken along the line corresponding to the line F—F of FIG. 1A.

As shown in FIG. 2A, the SAW element 210 has a piezoelectric substrate 211 as a base substrate. IDTs 213 and electrode pads 214 are formed on a first principal surface (the upper surface) of the piezoelectric substrate 211, and the IDTs 213 and the electrode pads 214 are electrically connected with wire patterns. As shown in FIG. 2B, electrode pads 205 are formed on the bottom surface (the die-attach surface) of a cavity 209 formed in a package 202. The electrode pads 205 are positioned with respect to the electrode pads 214 of the SAW element 210. The SAW element 210 is flip-chip mounted onto the die-attach surface, with the IDTs 213 and the electrode pads 214 facing the die-attach surface (this is referred to as a face-down state). Here, the electrode pads 214 are bonded to the electrode pads 205 with metal bumps 208, so that the electrode pads 214 and 205 are electrically and mechanically connected. The electrode pads 205 are electrically connected to foot patterns 207 through via wires 206 penetrating the bottom substrate of the package 202. The foot patterns 207 are formed on the bottom surface of the package 202. Signals are inputted and outputted through the foot patterns 207, and predetermined electrode pads are also grounded through the foot patterns 207. A metal cap 203 is bonded to the opening of the package 202 with a washer 204, so that the cavity 209 is hermetically sealed.

FIGS. 3A and 3B illustrate a duplexer that includes a SAW device having the same structure as one of the above SAW devices 100 and 200. In the example structure shown in FIGS. 3A and 3B, a SAW device having the same structure as the SAW device 100 shown in FIGS. 1A and 1B is employed. FIG. 3A is a section view of a duplexer 300, taken along the line corresponding to the line F—F of FIG. 1A. FIG. 3B is a top view of a SAW element 310.

As shown in FIG. 3A, the duplexer 300 has a SAW element 310 mounted on a package 302. Further, the duplexer 300 includes a substrate that has a matching circuit mounted thereon (the substrate will be hereinafter referred to as the matching circuit substrate 321), and a main substrate 322 that sandwiches the matching circuit substrate 321 with the package 302. The matching circuit substrate 321 is provided on the bottom surface of the package 302, and includes phase line paths. As shown in FIG. 3B, the SAW filter 310 includes a transmission filter 310a and a reception filter 310b. The transmission filter 310a and the reception filter 310b each includes IDTs 313 that are connected in a ladder-like fashion. The IDTs 313 are connected to electrode pads 314 through wire patterns 315.

When the SAW filter exhibits a rapid change in temperature in the above described structure, the size of the spontaneous polarization in the crystalline structure changes, and electric charges are generated on the surface of the piezoelectric substrate. In short, a pyroelectric effect occurs on the surface of the piezoelectric substrate. The electric charges are accumulated in the metal patterns (the IDTs, the electrode pads, the wires, and the like) formed on the surface of the piezoelectric substrate. As a result, sparks are caused between the metal patterns, more particularly, between the IDTs, and such sparks might damage the SAW element.

So as to solve this problem, a piezoelectric substrate having a crystalline power (or a discharging power) to reduce the amount of electric charges accumulated on the surface may be employed. Such a technique is disclosed in Japanese Unexamined Patent Publication No. 11-92147.

In the metal patterns formed on a piezoelectric substrate, however, the difference in the amount of accumulated electric charges is very large between grounded electrodes and ungrounded electrodes (or floating patterns). The discharging power of the piezoelectric substrate may be increased to eliminate such a large difference. However, a high discharging power leads to a great input signal loss and poorer filter characteristics.

SUMMARY OF THE INVENTION

It is therefore an object of the present invention to provide a surface acoustic wave device and a method of producing the surface acoustic wave device in which the above disadvantage is eliminated.

A more specific object of the present invention is to provide a surface acoustic wave device that can prevent deterioration of filter characteristics and eliminate the problem of the pyroelectric effect, and a method of producing the surface acoustic wave device.

The above objects of the present invention are achieved by a surface acoustic wave device comprising: interdigital transducers; first electrode pads that are connected to the interdigital transducers through wire patterns; and a piezoelectric substrate on which the interdigital transducers, the first electrode pads, and the wire patterns, are formed, at least one of the first electrode pads being not connected to a ground pattern, and the piezoelectric substrate having a conductivity in the range of $10^{-12}/\Omega \cdot cm$ to $10^{-6}/\Omega \cdot cm$.

The above objects of the present invention are also achieved by a method of producing a surface acoustic wave device having a piezoelectric substrate on which metal patterns including interdigital transducers and first electrode pads are formed, the method comprising the steps of: forming the metal patterns on the piezoelectric substrate having a conductivity in the range of $10^{-12}/\Omega \cdot cm$ to $10^{-6}/\Omega \cdot cm$; and bonding a substrate to the piezoelectric substrate, the substrate having second electrode pads aligned to the first electrode pads and a second layer formed in a region corresponding to the first layer, the bonding being performed by joining the first layer and the second layer to each other.

BRIEF DESCRIPTION OF THE DRAWINGS

Other objects, features and advantages of the present invention will become more apparent from the following detailed description when read in conjunction with the accompanying drawings, in which:

FIGS. 12A through 12F illustrate the steps of another method of producing the base substrate shown in FIGS. 8A through 8C;

DESCRIPTION OF THE PREFERRED EMBODIMENTS

Figure 1A:
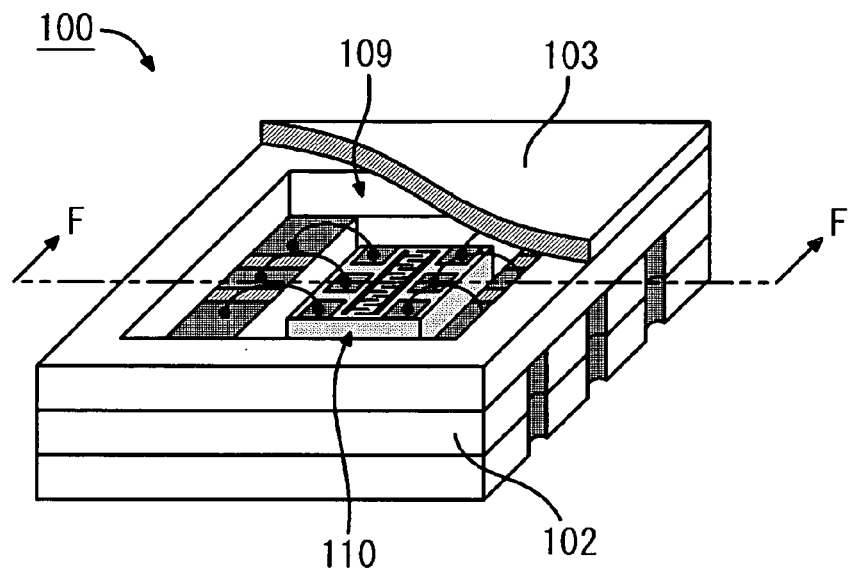
FIG. 1A is a perspective view of a conventional SAW device.
Figure 1B:
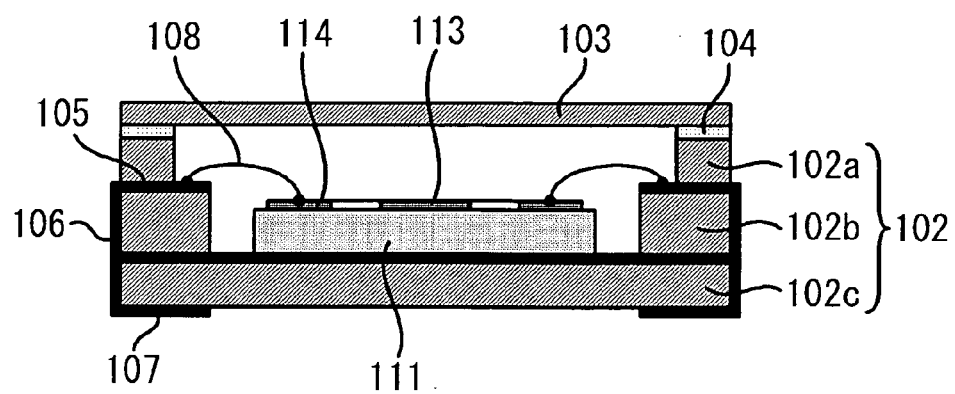
FIG. 1B is a section view of the conventional SAW device, taken along the line F—F of FIG. 1A.
Figure 2A:
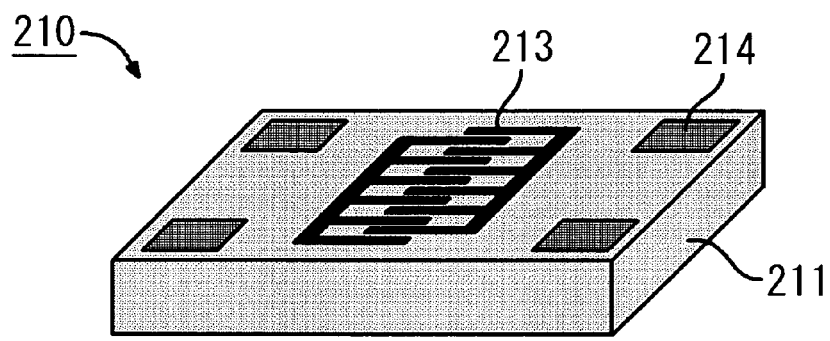
FIG. 2A is a perspective view of a SAW element to be mounted onto the die-attach surface of another conventional SAW device.
Figure 2B:
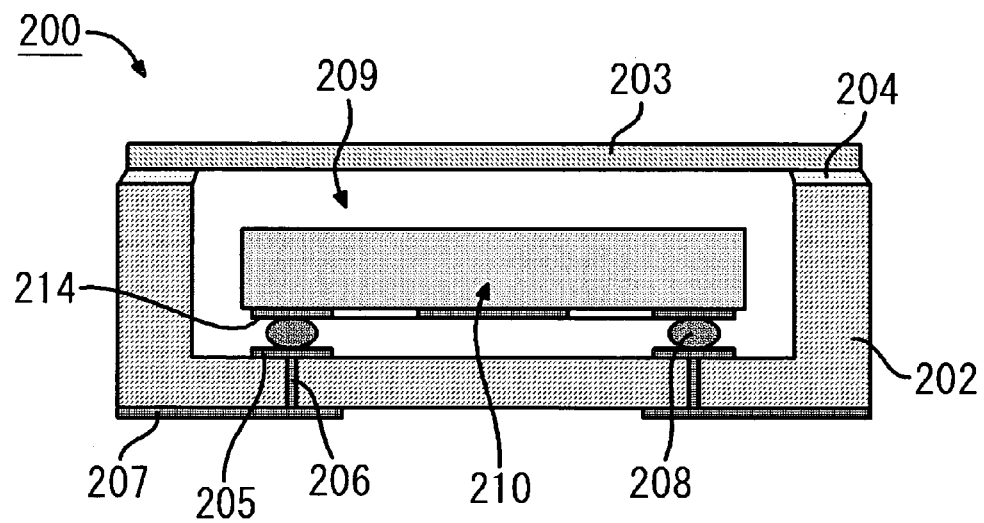
FIG. 2B is a section view of the conventional SAW device.
Figure 3A:
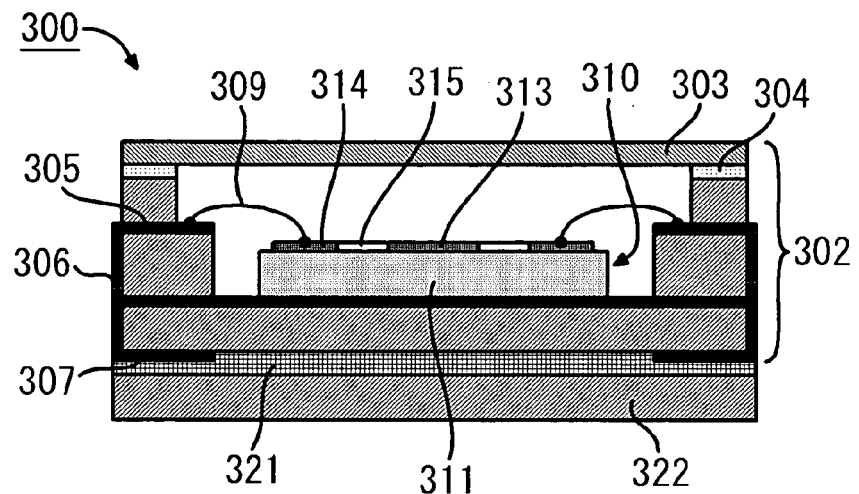
FIG. 3A is a section view of a conventional duplexer.
Figure 3B:
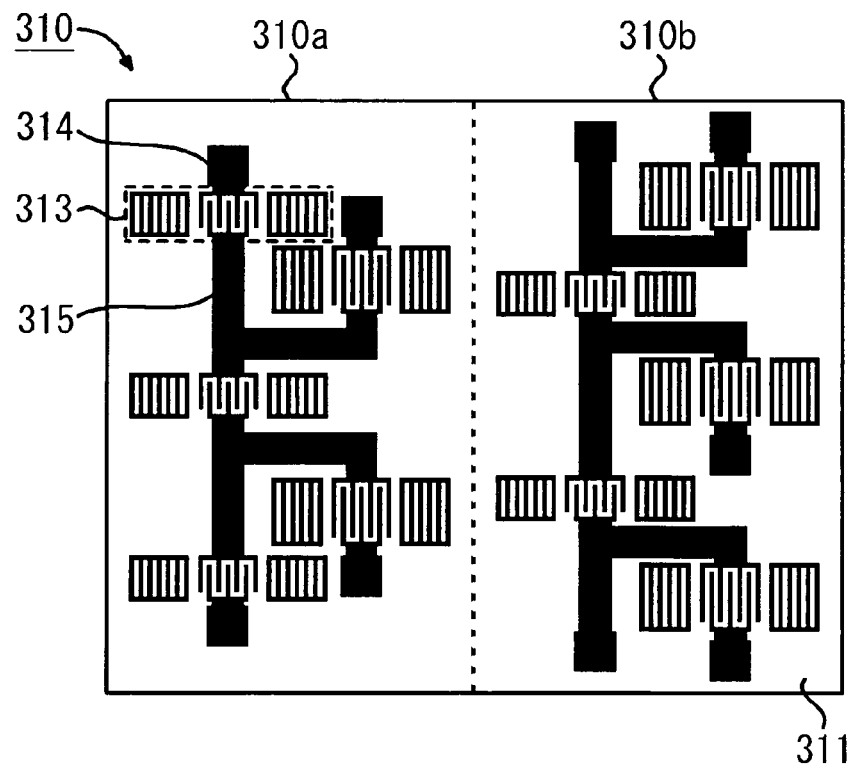
FIG. 3B is a top view of a SAW element to be mounted onto the die-attach surface of the conventional duplexer.
Figure 4A:
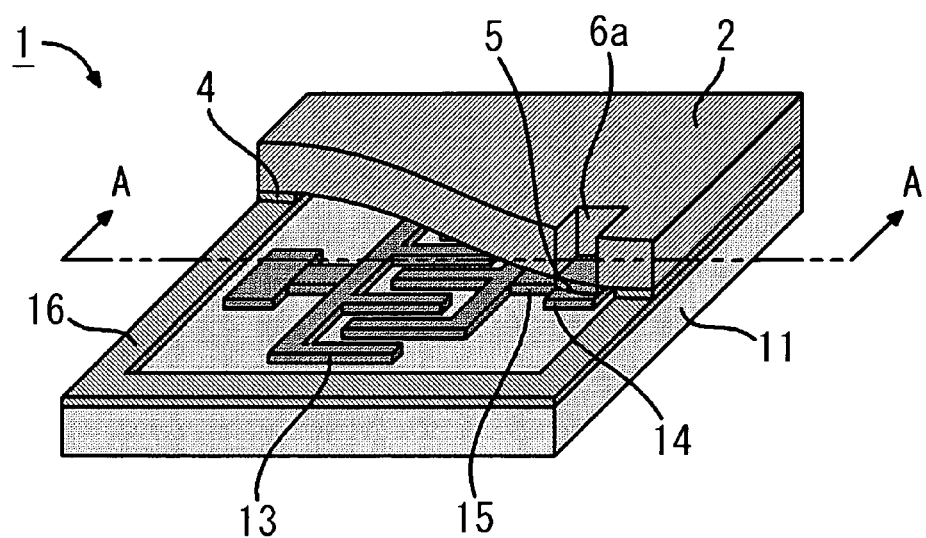
FIG. 4A is a perspective view of a SAW device that embodies the principles of the present invention.
Figure 4B:
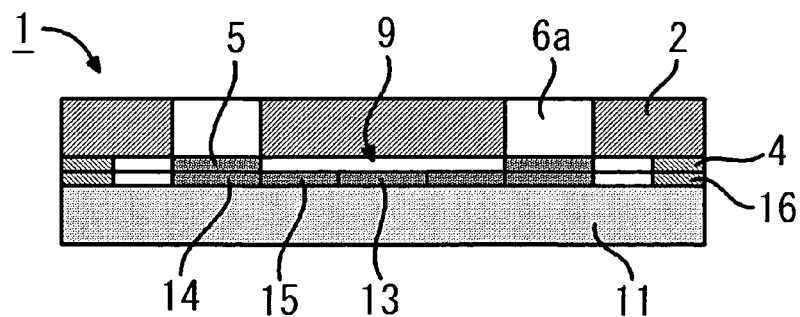
FIG. 4B is a section view of the SAW device, taken along the line A—A of FIG. 4A.

First, the principles of the present invention will be described. FIGS. 4A and 4B illustrate a structure that embodies the principles of the present invention. FIG. 4A is a perspective view of a surface acoustic wave (SAW) device 1 in accordance with the present invention. FIG. 4B is a section view of the SAW device 1, taken along the line A—A of FIG. 4A.

As shown in FIGS. 4A and 4B, the SAW device 1 includes: a piezoelectric substrate 11 that has metal patterns (including interdigital transducers (IDTs) 13, electrode pads 14, and wire patterns 15 connecting the IDTs 13 and the electrode pads 14) formed on a predetermined surface (this surface will be hereinafter referred to as the principal surface or the upper surface of the piezoelectric substrate 11); and a base substrate 2 that has electrode pads 5 formed on a predetermined surface (this surface will be hereinafter referred to as the principal surface or the upper surface of the base substrate 2). The electrode pads 5 are aligned to the electrode pads 14. When the substrates 11 and 2 are joined to each other, the electrode pads 14 and the electrode pads 5 are connected at the same time.

In the above structure, the piezoelectric substrate 11 may be a piezoelectric single-crystal substrate of 42° rotated Y-cut X-propagation lithium tantalate (LiTaO$_3$), for example. This type of piezoelectric substrate will be hereinafter referred to as a LT substrate. Also, the piezoelectric substrate 11 may be a piezoelectric single-crystal substrate of rotated Y-cut lithium niobate (LiNbO$_3$) (hereinafter referred to as a LN substrate), a crystal substrate, or the like.

In the present invention, the piezoelectric substrate 11 is made of a piezoelectric material having a crystalline power great enough to discharge accumulated electric charges from the metal patterns, so that the voltage generated among the metal patterns (hereinafter referred to as the generated voltage E) does not exceed such a voltage as to break the insulation in an atmosphere or a vacuum filling a cavity 9. In the examples described in the following description, the cavity 9 is filled with a vacuum, and such a voltage as to break the insulation will be referred to as the insulating braking voltage E$_0$. The piezoelectric substrate 11 needs to satisfy the following conditions.

The generated voltage E is unavoidably generated due to a pyroelectric effect. A piezoelectric substrate normally generates a constant voltage, utilizing temperature differences. At a point with a certain temperature difference after a certain period of time, the generated voltage and the natural discharging voltage reach the saturation point, and a constant voltage is generated. In the present invention, this constant voltage is the generated voltage E. Being invariable regardless of temperature differences, the generated voltage E is neutralized with conductivity to reduce the ultimate generated voltage.

The generated voltage E of the piezoelectric substrate 11 that is a LT substrate can be expressed by the following expression (1):

$$E = \alpha W \frac{\exp\left(-\frac{t}{\tau_1}\right) - \exp\left(-\frac{t}{\tau_2}\right)}{\frac{1}{\tau_2} - \frac{1}{\tau_1}} \quad (1)$$

where: α is a coefficient expressed by an expression (2) shown below; $\tau_1$ is the thermal time constant that represents the heat radiation efficiency of the piezoelectric substrate 11; and $\tau_2$ is the electric time constant that represents the discharge efficiency of the piezoelectric substrate 11.

$$\alpha = \frac{P_{ij}}{\varepsilon_0} \varepsilon_s C' \quad (2)$$

where: C' is the volume specific heat of the crystal in the piezoelectric substrate 11; $\varepsilon_0$ is the dielectric constant of the vacuum; $\varepsilon_s$ is the dielectric constant of the piezoelectric substrate 11; and $P_{ij}$ is the pyroelectric coefficient of the piezoelectric substrate 11. In the piezoelectric substrate 11 of the present invention, the dielectric constant $\varepsilon_s$ may be $\varepsilon^{33}=38\times10^{-12}$ [F/m], and the pyroelectric coefficient $P_{ij}$ may be $P_{33}=23\times10^{-5}$ [c/m$^2$·K], for example. In the experiment described below, the temperature of the piezoelectric substrate 11 was varied in the range of 60 degrees C., with the temperature rising rate of 2 degrees C. per second.

Figure 5:
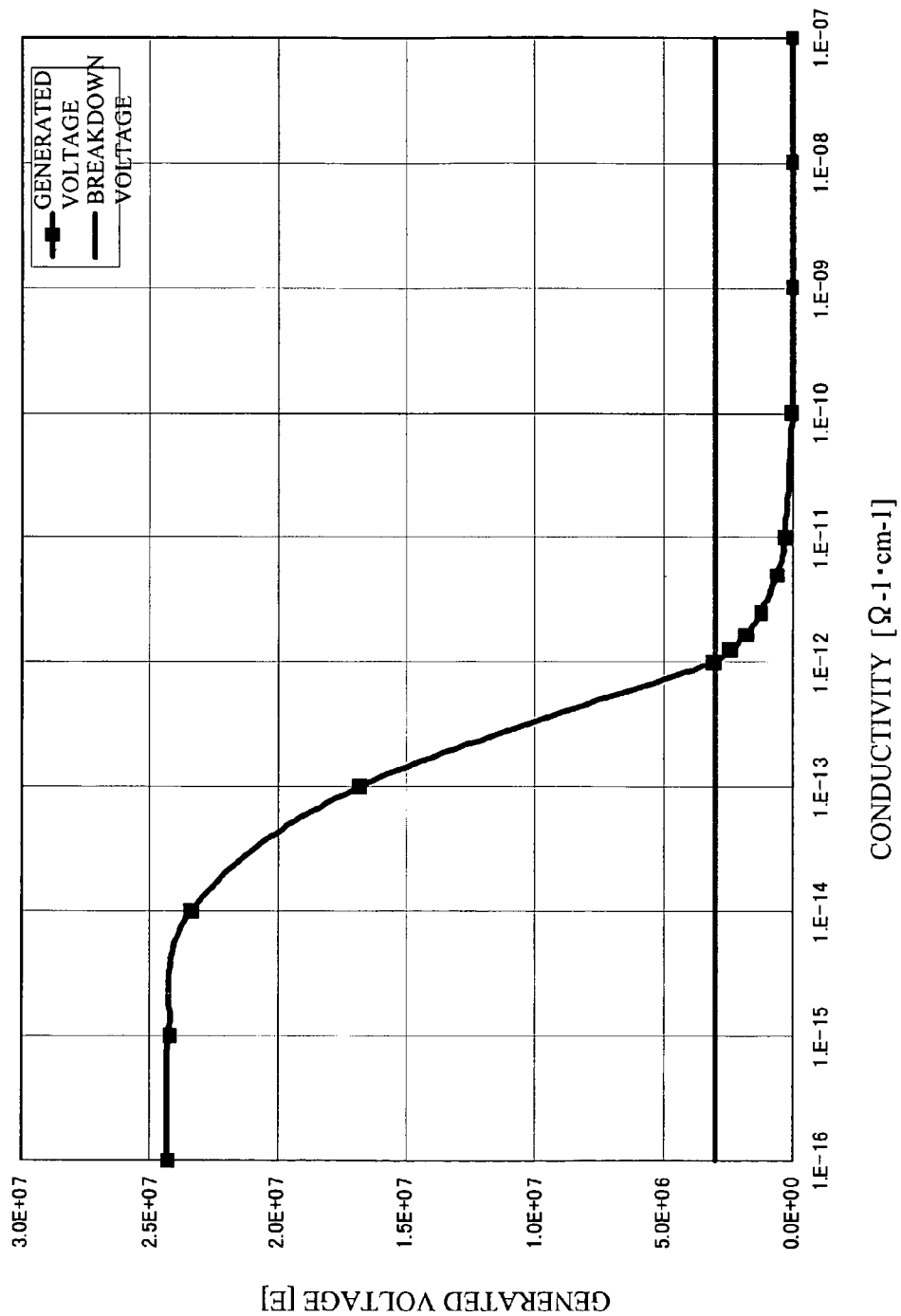
FIG. 5 is a graph showing the breakdown voltage $E_0$ and the relationship between the conductivity $\gamma$ and the generated voltage E of the piezoelectric substrate in accordance with the principles of the present invention.

If the breakdown voltage E$_0$ exhibits a normal value of $3\times10^6$ [v/m], breakdown due to a pyroelectric effect does not occur unless the generated voltage E exceeds the value. In the present invention, the relationship between the conductivity γ and the generated voltage E is examined so as to determine the optimum conductivity γ. More specifically, the conductivity γ is determined so that a greater discharging power than the efficiency in generating electric charges on the substrate can be achieved. FIG. 5 shows the relationship between the conductivity γ and the generated voltage E, as well as the breakdown voltage E$_0$. As is apparent from FIG. 5, the generated voltage E exceeds the breakdown voltage E$_0$ (E>E$_0$) as the conductivity γ becomes lower than $10^{-12}$ [Ω-1 cm-1] More specifically, when the conductivity γ becomes smaller than $10^{-12}$ [Q-1·cm-1], the generated voltage E exceeds the breakdown voltage E$_0$, and a pyroelectric effect occurs in the metal patterns. Therefore, the conductivity γ of the piezoelectric substrate 11 is made $10^{-12}$ or higher in the present invention, so as to prevent a pyroelectric effect.

If the conductivity γ of the piezoelectric substrate 11 is made too high, however, the input signal loss increases, and the filter characteristics deteriorate. Therefore, the upper limit of the conductivity γ is set at $10^{-6}$ in the present invention. By doing so, the amount of electric charges to be discharged can be minimized, and filter characteristics deterioration can be restricted.

The other aspects of this structure will now be described. The electrode pads 5 on the base substrate 2 are exposed to the outside through the principal surface (the back surface or the lower surface) of the base substrate 2, with vias 6a piercing the base substrate 2. Accordingly, via wires can be formed by filling the vias 6a with conductive materials such as metal bumps. With the via wires formed in that manner, the input and output terminals of the IDTs 13 can be extended to the back surface of the base substrate 2.

The IDTs 13, the electrode pads 14, the wire patterns 15, and a layer 16, are formed on the principal surface of the piezoelectric substrate 11, as mentioned earlier. The IDTs 13, the electrode pads 14, the wire patterns 15, and the layer 16, are conductive bodies that mainly contain gold (Au), aluminum (Al), copper (Cu), titanium (Ti), chromium (Cr), or tantalum (Ta). The IDTs 13, the electrode pads 14, the wire patterns 15, and the layer 16, may be single-layer conductive films containing at least one of the above mentioned materials, or laminated conductive films each having at least two layers of conductive films containing at least one of the above mentioned materials. The metal patterns may be formed by a sputtering technique, for example.

The base substrate 2 may be an insulating substrate that contains as the main component at least one of the following materials that have conventionally been used for SAW device packages: ceramics, aluminum ceramics (alumina), bismuthimide triazine resin, polyphenylene ether, polyimide resin, glass epoxy, and glass cloth. In the embodiments of the present invention described below, however, a silicon substrate that is a semiconductor substrate is employed, because it is easy to process and can be produced in the form of a wafer. More preferably, a silicon substrate that is made of a silicon material having a resistivity of 1000Ω·cm or higher should be employed to prevent filter characteristics deterioration due to the resistance of the silicon substrate.

The electrode pads 5 and a layer 4 are formed on the principal surface of the base substrate 2 by a sputtering technique, or the like. The electrode pads and the layer 4 may be single-layer conductive films containing at least one of the following materials: gold (Au), aluminum (Al), copper (Cu), titanium (Ti), chromium (Cr), and tantalum (Ta). Alternatively, the electrode pads 5 and the layer 4 may be laminated conductive films each having two layers of conductive films containing at least one of the following materials: gold (Au), aluminum (Al), copper (Cu), titanium (Ti), chromium (Cr), and tantalum (Ta).

The layers 16 and 4 that have been positioned with respect to each other are formed on the outer peripheral areas of the principal surfaces of the piezoelectric substrate 11 and the base substrate 2, respectively. The layers 16 and 4 are bonded to each other, so that the space (or cavity) to accommodate the metal patterns between the piezoelectric substrate 11 and the base substrate 2 can be formed and hermetically sealed.

The joining of the piezoelectric substrate 11 and the base substrate 2 can be carried out with an adhesive material such as resin. However, it is more preferable to join the layers 16 and 4 directly to each other at ordinary temperatures. Further, the joining strength can be increased by subjecting the joining surfaces (the upper surfaces of the layers 16 and 4, and the electrode pads 14 and 5) to surface activation treatment. In the following, the joining technique utilizing surface activation treatment will be described in detail.

Figure 6A:
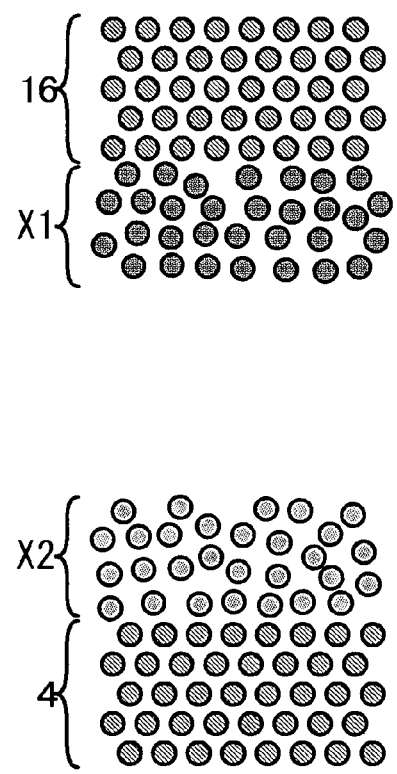
FIGS. 6A and 6B illustrate the bonding technique utilizing surface activation treatment in accordance with the principles of the present invention.

As shown in FIG. 6A, the joining surfaces are first washed by the RCA cleaning technique to remove impurities X1 and X2 such as oxides and adsorbates adhering to the joining surfaces. In accordance with the RCA cleaning technique, washing is performed with a cleaning liquid that is produced by mixing ammonia, hydrogen peroxide, and water at a compounding ratio (volume ratio) of 1:1-2:5-7, or a cleaning liquid that is produced by mixing chlorine, hydrogen peroxide, and water at a compounding ratio (volume ratio) of 1:1-2:5-7.

Figure 6B:
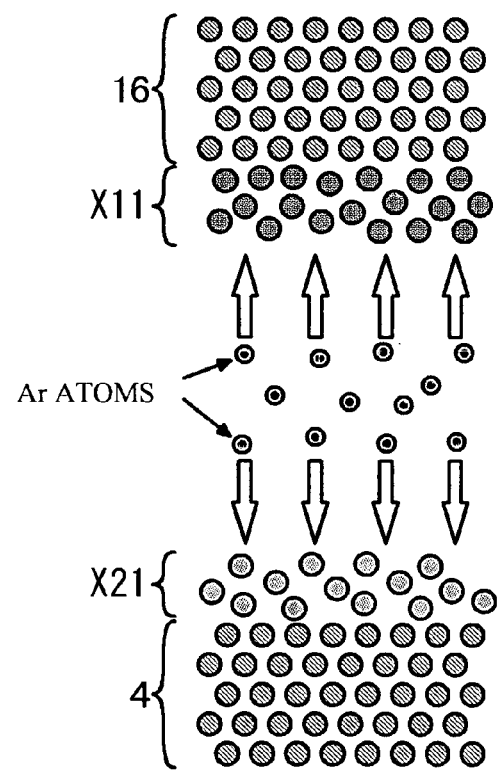

After the washed substrates are dried, the joining surfaces are exposed to ion beams, neutralized beam or plasma of an inert gas such as argon (Ar) or oxygen, as shown in FIG. 6B. By doing so, the remaining impurities X11 and X21 are removed, and the outer layers are activated. Particle beams and plasma are arbitrarily selected based on the types of the materials of the substrates to be joined. Although surface activation treatment using an inert gas is effective with various materials, oxygen ion beams and plasma are also effective with materials such as silicon oxide ($SiO_2$).

The layers 16 and 4, as well as the electrode pads 14 and 5, are then aligned and bonded to each other. Although the bonding process for most materials can be carried out in a vacuum, it might be possible to carry out such a joining process in the air or in an atmosphere of a high-purity gas such as nitrogen or inert gas. Also, it might be necessary to press the two substrates 11 and 2 against each other. This process can be carried out at ordinary temperatures or in a space heated to 100 degrees C. or lower. The joining process is carried out in a space heated to 100 degrees C. or lower, so as to increase the joining strength.

In the joining process utilizing surface activation treatment, it is not necessary to perform annealing at a high temperature of 1000 degrees C. or higher after the joining. Accordingly, the substrates are not damaged, and various types of substrates can be employed. As there is no need to use an adhesive material such as resin for bonding the two substrates, the package can be made thinner. Thus, a smaller package can be realized. Furthermore, the above joining process can be carried out on substrates in the form of wafers. Accordingly, more than one SAW device can be obtained at once from a piezoelectric substrate and a base substrate both having a multiple structure. Thus, the production procedures can be simplified, and a higher production yield can be achieved.

Based on the above principles, the present invention can provide SAW devices that exhibit excellent filter characteristics and do not have a pyroelectric effect. Also, the cavity 9 that accommodates the IDTs 13 can be minimized in size. Furthermore, as the joining technique utilizing surface activation treatment is employed for joining the piezoelectric substrate 11 and the base substrate 2, a smaller joining area is required to secure a sufficient joining strength. Accordingly, the size of each SAW device can be minimized. Also, as the base substrate 2 is a silicon substrate that is inexpensive and easy to process in the form of a wafer, the production procedures can be simplified, and inexpensive SAW devices can be produced with a higher yield. In the following, embodiments based on the above principles of the present invention will be described in detail.

First Embodiment

Figure 7A:
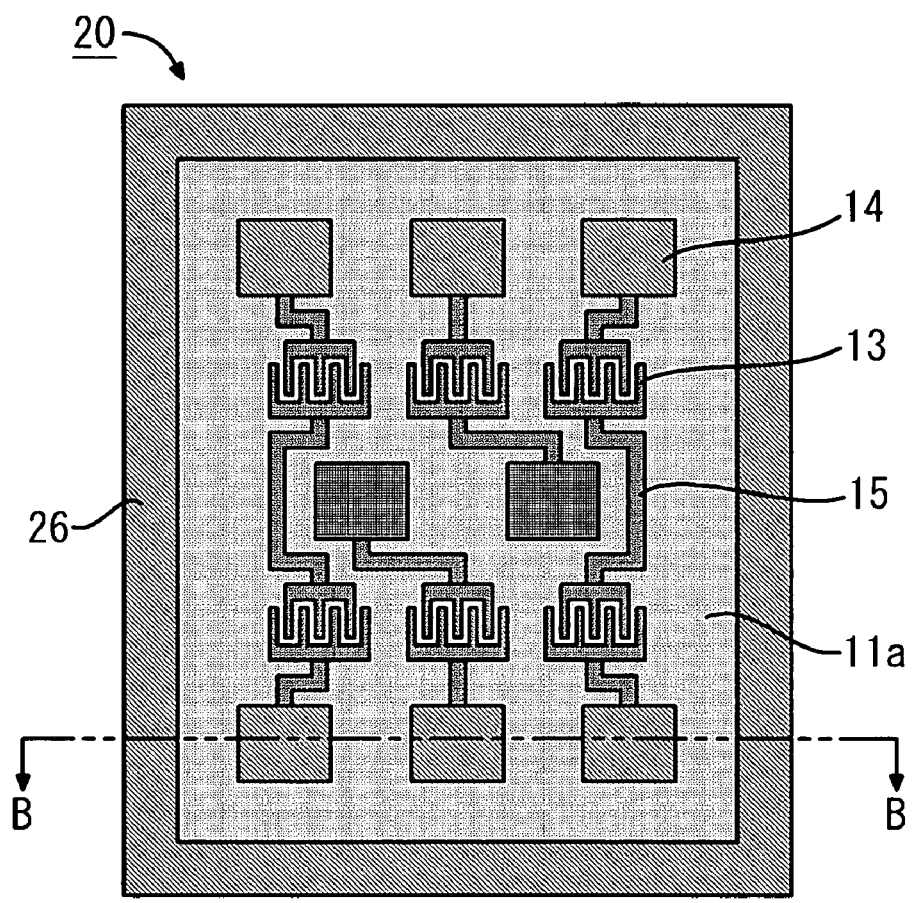
FIG. 7A is a top view of a SAW element in accordance with a first embodiment of the present invention.
Figure 7B:
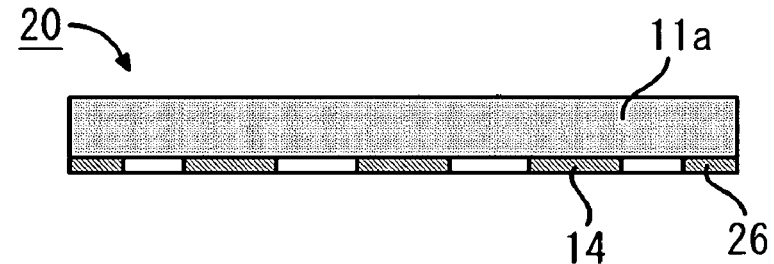
FIG. 7B is a section view of the SAW element, taken along the line B—B of FIG. 7A.
Figure 8A:
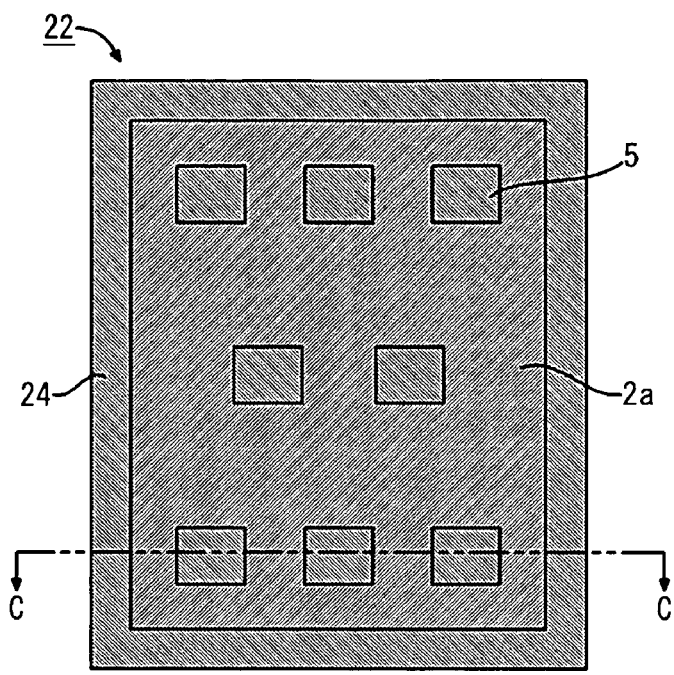
FIG. 8A is a top view of a base substrate in accordance with the first embodiment of the present invention.
Figure 8B:
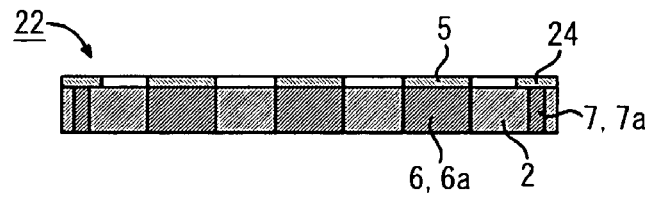
FIG. 8B is a section view of the base substrate, taken along the line C—C of FIG. 8A.
Figure 8C:
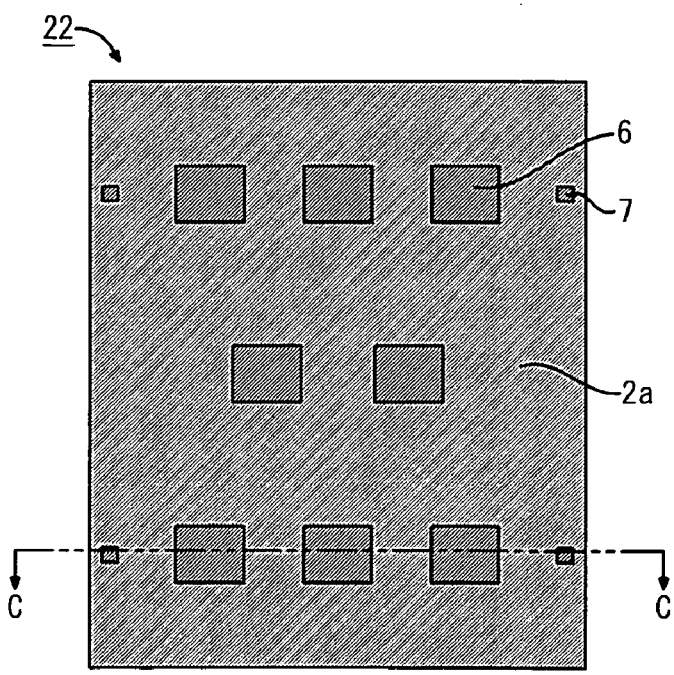
FIG. 8C is a bottom view of the base substrate of FIG. 8A.
Figure 9:
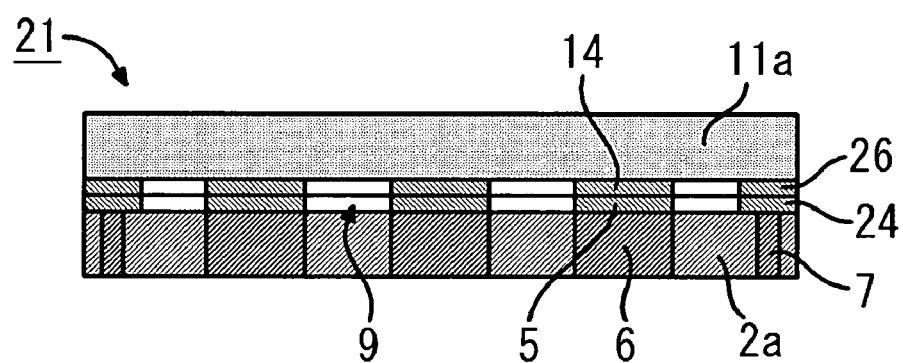
FIG. 9 is a section view of a SAW device in accordance with the first embodiment of the present invention.

Referring now to FIGS. 7A through 9, a first embodiment of the present invention will be described in detail. FIGS. 7A through 9 illustrate a SAW device 21 in accordance with this embodiment. More specifically, FIG. 7A is a top view of a SAW element 20 to be employed in the SAW device 21. FIG. 7B is a section view of the SAW element 20, taken along the line B—B of FIG. 7A. FIG. 8A is a top view of a base substrate 22 to be employed in the SAW device 21. FIG. 8B is a section view of the base substrate 22, taken along the line C—C of FIG. 8A. FIG. 8C is a bottom view of the base substrate 22. FIG. 9 is a section view of the SAW device 21, taken along the line corresponding to the line B—B of FIG. 7A and the line C—C of FIG. 8A.

As shown in FIGS. 7A and 7B, the SAW element 20 of this embodiment employs a LT substrate 11a as the piezoelectric substrate 11. The IDTs 13 connected in a ladder-like fashion, the electrode pads 14, and the wire patterns 15 connecting the IDTs 13 and the electrode pads 14, are formed as metal patterns on the principal surface of the LT substrate 11a. The structures of the IDTs 13, the electrode pads 14, and the wire patterns 15, are the same as those described earlier, and therefore, explanation of them is omitted herein.

A pyroelectric effect can be prevented by grounding the electrode pads 14 of the metal patterns through high-resistance wire patterns. In that case however, the electrode pads that are located near the center of the substrate are left unconnected to a ground pattern (such electrode pads are also referred to as floating patterns). As a result, the potential difference between the ungrounded electrode pads and the surrounding metal patterns might become so large as to cause sparks. To avoid such an undesirable situation in this embodiment, the piezoelectric substrate 11 (the LT substrate 11a) is made of a substrate material having a crystalline power high enough to serve as a conductive body at radio frequencies. Accordingly, all the metal patterns can be grounded at radio frequencies, and occurrence of a pyroelectric effect can be restricted.

As shown in FIGS. 8A through 8C, the base substrate 22 of this embodiment is a silicon substrate 2a. The electrode pads 5 that are aligned to the electrode pads 14 are formed on the principal surface of the silicon substrate 2a. The structures of the electrode pads 5 are the same as those described earlier, and therefore, explanation of them is omitted herein.

As shown in FIGS. 7A through 8C, a layer 26 that has the same film thickness as each of the electrode pads 14 is formed in the outer peripheral region of the SAW element 20, and a layer 24 that has the same film thickness of each of the electrode pads 5 is formed in the outer peripheral region of the base substrate 22 or in the region corresponding to the layer 26. The layer 26 and the layer 24 are joined directly to each other, so that the SAW element 20 and the base substrate 22 are joined to each other. Here, the joining surfaces of the layer 26 and the layer 24 are subjected to surface activation treatment to increase the joining strength between the layer 26 and the layer 24. With the increased joining strength, the joining area can be reduced, and the resultant device can be also made smaller in size.

The layers 26 and 24 are made of the same metallic material as the electrode pads 14 and 5, for example. Accordingly, the connecting of the electrode pads 14 and 5 and the joining of the layers 26 and 24 can be performed in a single step. Thus, the production procedures can be simplified.

Also, the metal patterns on the piezoelectric substrate 11 are normally located at a certain distance from the outer periphery, so that sparks due to the potential difference between the metal patterns on the piezoelectric substrate 11 and other metal patterns can be prevented. Accordingly, the layers 26 and 24 made of a metallic material may be grounded through the back surface of the base substrate 22. By doing so, more of the electric charges generated on the surface of the piezoelectric substrate 11 can be discharged, and occurrence of a pyroelectric effect can be further restricted.

FIG. 9 shows the SAW device 21 that can be produced by face-down bonding the SAW element 20 having the above structure to the principal surface of the base substrate 22, with the principal surfaces of the substrates 11 and 22 facing each other. This structure is the same as the structure based on the principles of the present invention.

Next, a method of producing the SAW device 21 in accordance with this embodiment will be described, with reference to the accompanying drawings. FIGS. 10A through 10J illustrate the production procedures for producing the SAW element 20 of the SAW device 21. FIGS. 11A through 11F illustrate the production procedures for producing the base substrate 22. In accordance with this method, SAW elements 20 are formed and two-dimensionally arranged on a single wafer, and base substrates 22 are also formed and two-dimensionally arranged on another wafer. These wafers are then bonded to each other, and are then divided into individual SAW devices 21.

Figure 10A:
FIGS. 10A through 10J illustrate the steps of a method of producing the SAW element shown in FIGS. 7A and 7B.
Figure 10B:
Figure 10C:
Figure 10D:

Referring now to FIGS. 10A through 10J, the wafer of a multiple structure on which SAW elements 20 are to be two-dimensionally arranged will be described in detail. As shown in FIG. 10A, a LT substrate 11A having a thickness of 250 μm is prepared before the SAW elements 20 are formed. As shown in FIG. 10B, a electrode film 13A mainly containing a metallic material such as aluminum (Al) is formed as the foundation layer of the IDTs 13, the electrode pads 14, the wire patterns 15, and the layer 26. Masks M1 having shapes corresponding to the patterns including the IDTs 13, the electrode pads 14, the wire patterns 15, and the layer 26 (see FIG. 7A) are formed on the electrode film 13A by a photolithography technique, as shown in FIG. 10C. Etching is then performed on the principal surface having the masks M1, so as to form an electrode film 13B that is patterned upon the shapes of the IDTs 13, the electrode pads 14, the wire patterns 15, and the layer 26, as shown in FIG. 10D.

Figure 10E:
Figure 10F:
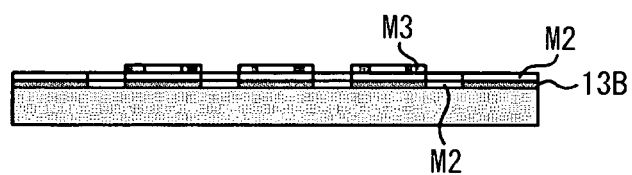
Figure 10G:
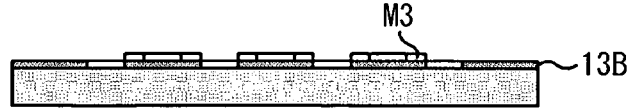
Figure 10H:
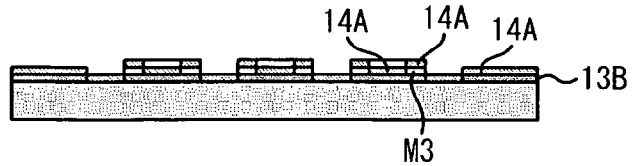
Figure 10I:
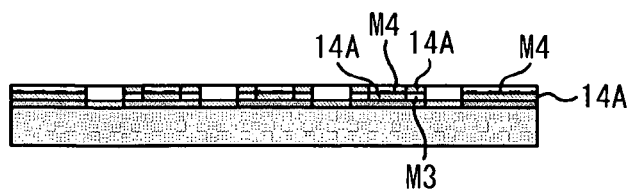
Figure 10J:
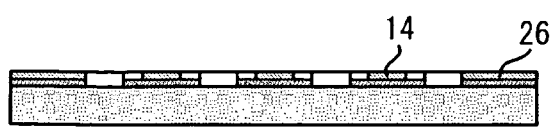

After the electrode film 13B is formed as the foundation layer of the IDTs 13, the electrode pads 14, the wire patterns 15, and the layer 26, the remnants of the masks M1 are removed, and an insulating film M2 made of silicon oxide ($SiO_2$), or the like, is formed to cover the entire principal surface on which the electrode film 13B is formed, as shown in FIG. 10E. Masks M3 are then formed by a photolithography technique, so that only the electrode pads 14, the wire patterns 15, and the layer 26, have laminated structures, as shown in FIG. 10F. Etching is then performed on the principal surface having the masks M3, as shown in FIG. 10G. After the etching, a metal film 14A is formed to cover the entire substrate, as shown in FIG. 10H. Masks M4 are further formed by a photolithography technique, so that the metal film 14A is removed from the regions exclusive of at least the IDTs 13, the electrode pads 14, and the layer 26, as shown in FIG. 10I. Etching (lifting-off) is then performed on the substrate. After the etching, the IDTs 13, the electrode pads 14, the wire patterns 15, and the layer 26, are formed, though only the electrode pads 14 and the layer 26 are shown in FIG. 10J. Here, at least the electrode pads 14 and the layer 26 should preferably have the same film thicknesses. In this manner, the base substrate 22 and the SAW element 20 can be bonded to each other, without such problems that the IDTs 13 are brought into contact with some other component and that the electrode pads 14 are not joined to the electrode pads 5.

Figure 11A:
FIGS. 11A through 11F illustrate the steps of a method of producing the base substrate shown in FIGS. 8A through 8C.
Figure 11B:
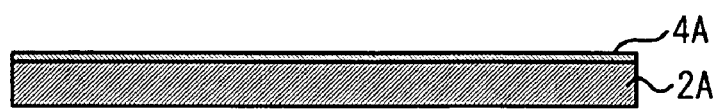
Figure 11C:
Figure 11D:
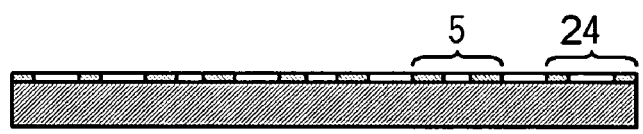

As for the production of the base substrate 22, a silicon substrate 2A having a thickness of 250 μm is first prepared, as shown in FIG. 11A. A metal film 4A to be later processed to form the electrode pads 5 and the layer 24 is then formed on the principal surface of the silicon substrate 2A, as shown in FIG. 11B. After that, masks M5 for patterning the metal film 4A upon the shapes of the electrode pads 5 and the layer 24 are formed by a photolithography technique, as shown in FIG. 11C. Etching is then performed on the substrate, so that the electrode pads 5 and the layer 24 are formed, as shown in FIG. 11D.

Figure 11E:
Figure 11F:
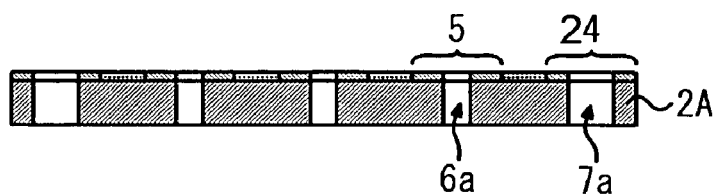

Vias 6a and 7a for electrically extending the electrode pads 5 and the layer 24 to the bottom surface of the silicon substrate 2A are formed in the next step. In this step, masks M6 are formed on regions exclusive of the regions to form the vias 6a and 7a, by a photolithography technique, as shown in FIG. 11E. Reactive ion etching (RIE, or more particularly, deep-RIE) is then performed on the substrate. As a result, the vias 6a and 7a extending in the vertical direction are formed, as shown in FIG. 11F. The remnants of the masks M6 are removed after the etching.

After the SAW element 20 and the base substrate 22 are formed in the above manner, the two substrates 11A and 2A are joined to each other by the joining technique described earlier with reference to FIGS. 6A and 6B. By doing so, the SAW device 21 shown in FIG. 9 can be obtained. The vias 6a and 7a shown in FIG. 11F are filled with conductive materials such as metal bumps (equivalent to the via wires 6 and 7 in FIG. 9), as mentioned earlier. With this structure, the electrodes pads 14 and 5 and the layers 26 and 24 are electrically extended to the bottom surface of the base substrate 22. The process of filling the vias with conductive materials may be carried out either before or after the joining of the substrates 11A and 2A.

In the method of producing the base substrate 22 shown in FIGS. 11A through 11F, etching (or deep-RIE) is performed on the surface having the metal film 4A formed thereon, and all the steps are carried out on the same surface (the principal surface). However, it is possible to perform etching (or deep-RIE) on the opposite surface (the bottom surface) from the surface having the metal film 4A thereon. This will be described below, with reference to FIGS. 12A through 12F.

The procedures shown in FIGS. 12A and 12B are the same as the procedures shown in FIGS. 11A and 11B. After the procedure shown in FIG. 12B, masks M5' for patterning the metal film 4A upon the shapes of electrode pads 5' and a layer 24' are formed by a photolithography technique, as shown in FIG. 12C. Etching is then performed on the substrate, as shown in FIG. 12D. By doing so, the electrode pads 5' and the layer 24' are formed.

Masks M6' are then formed on the bottom surface of the silicon substrate 2A by a photolithography technique, as shown in FIG. 12E (note that FIGS. 12E and 12F show the silicon substrate 2A upside down). RIE (or more particularly, deep-RIE) is then performed on the silicon substrate 2A, so as to form vias 6a and 7a, as shown in FIG. 12F. The remnants of the masks M6' are removed after the etching.

By this method, etching is not performed on the layer 24' and the electrode pads 5'. Accordingly, self-alignment of the layers 24' and 26 and the electrode pads 5' and 14 can be realized in the joining step. Thus, the production procedures can be simplified. The SAW element 20 to be joined to this base substrate can be produced through the same procedures as the production procedures shown in FIGS. 10A through 10J.

By each of the above production methods, the SAW element 20 and the base substrate 22 are produced separately, and are then joined to each other. However, it is also possible to form the vias 6a and 7a in the silicon substrate 2A after the SAW element 20 and the base substrate 22 are joined to each other. This method will be described below in detail, with reference to FIGS. 13A through 13G. In this method, the production procedures for producing the SAW element 20 are also the same as the procedures shown in FIGS. 10A through 10J.

Figure 13A:
FIGS. 13A through 13G illustrate the steps of a method of producing the SAW device shown in FIG. 9.
Figure 13B:
Figure 13C:
Figure 13D:
Figure 13E:
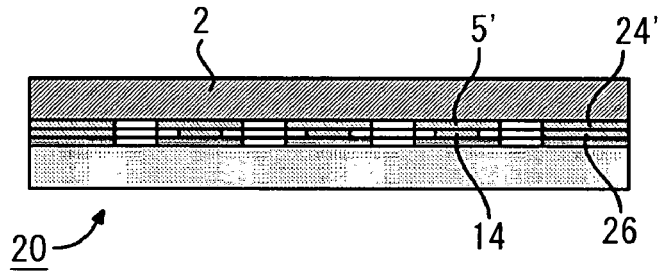
Figure 13F:
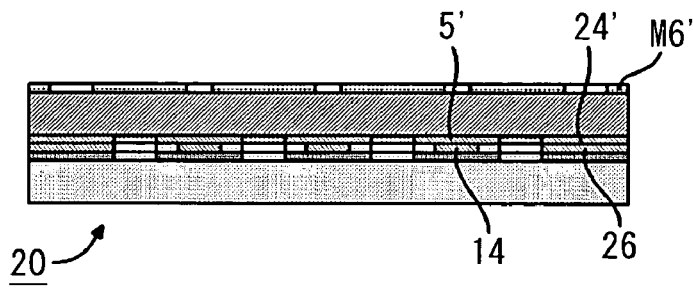
Figure 13G:
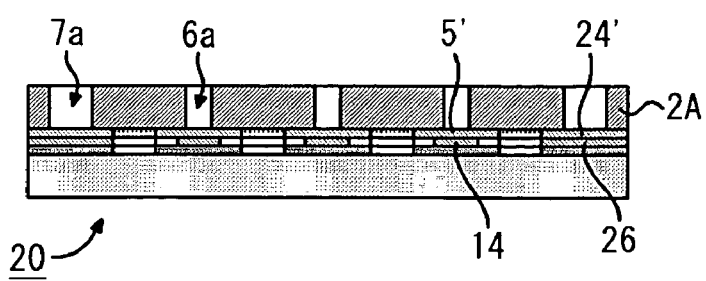

The procedures shown in FIGS. 13A through 13D are the same as the procedures shown in FIGS. 12A through 12D. After the procedure shown in FIG. 13D, the SAW element 20 shown in FIG. 9 is bonded to the principal surface of the silicon substrate 2A, as shown in FIG. 13E (note that FIGS. 13E through 13G show the silicon substrate 2A upside down). Masks M6' are then formed on the bottom surface of the silicon substrate 2A by a photolithography technique, as shown in FIG. 13F. RIE (or more particularly, deep-RIE) is performed on the bottom surface of the silicon substrate 2A, so as to form the vias 6a and 7a, as shown in FIG. 13G. The remnants of the masks M6' are removed after the etching.

By this production method, etching is not performed on the layer 24' and the electrode pads 5'. Accordingly, self-alignment of the layers 24' and 26 and the electrode pads 5' and 14 can be realized in the joining step. Thus, the production procedures can be simplified.

By any of the above production methods of this embodiment, the SAW device 21 having the above described structure and effects can be produced.

Second Embodiment

Figure 14A:
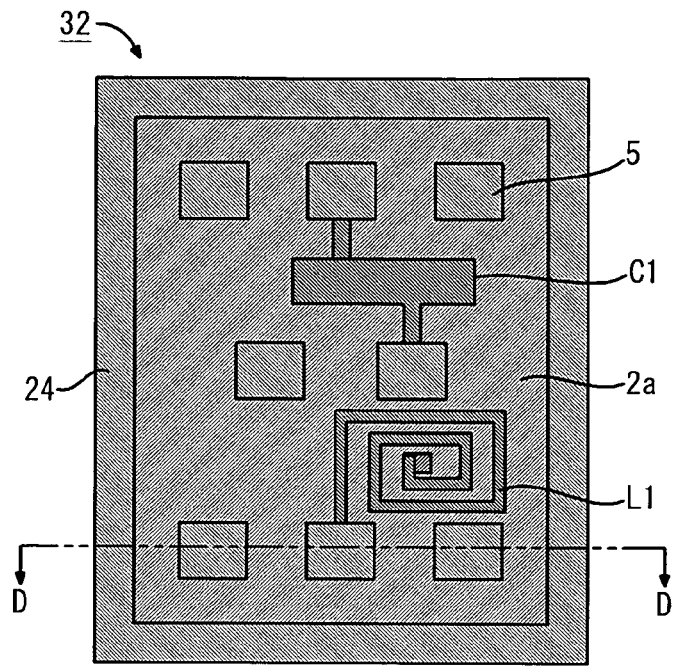
FIG. 14A is a top view of a base substrate in accordance with a second embodiment of the present invention.
Figure 14B:
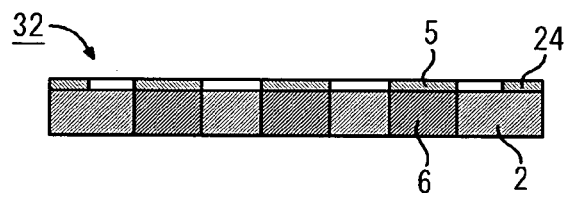
FIG. 14B is a section view of the base substrate, taken along the line D—D of FIG. 14A.
Figure 14C:
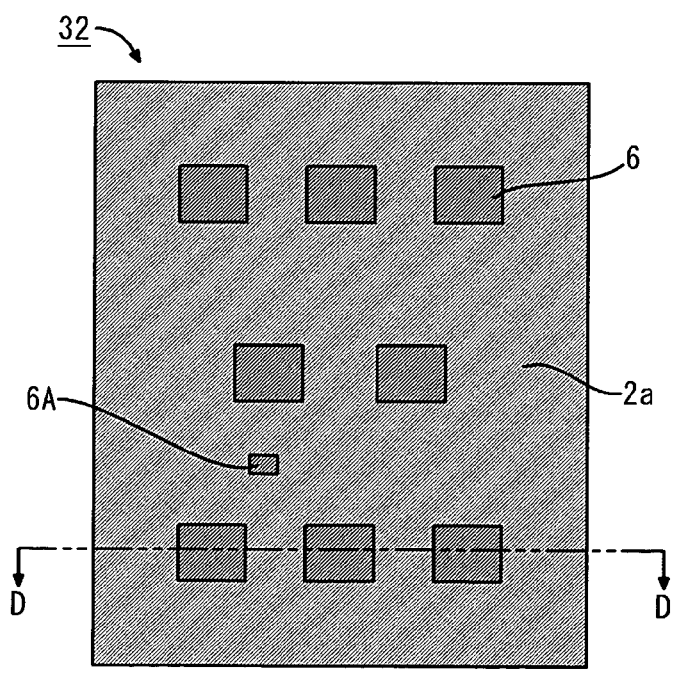
FIG. 14C is a bottom view of the base substrate of FIG. 14A.

Referring now to FIGS. 14A through 14C, a second embodiment of the present invention will be described in detail. FIGS. 14 through 14C illustrate a base substrate 32 to be employed in a SAW device in accordance with this embodiment. FIG. 14A is a top view of the base substrate 32. FIG. 14B is a section view of the base substrate 32, taken along the line D—D of FIG. 14A. FIG. 14C is a bottom view of the base substrate 32. A SAW element in accordance with this embodiment may have the same structure as the SAW element 20 in accordance with the first embodiment.

Figure 15:
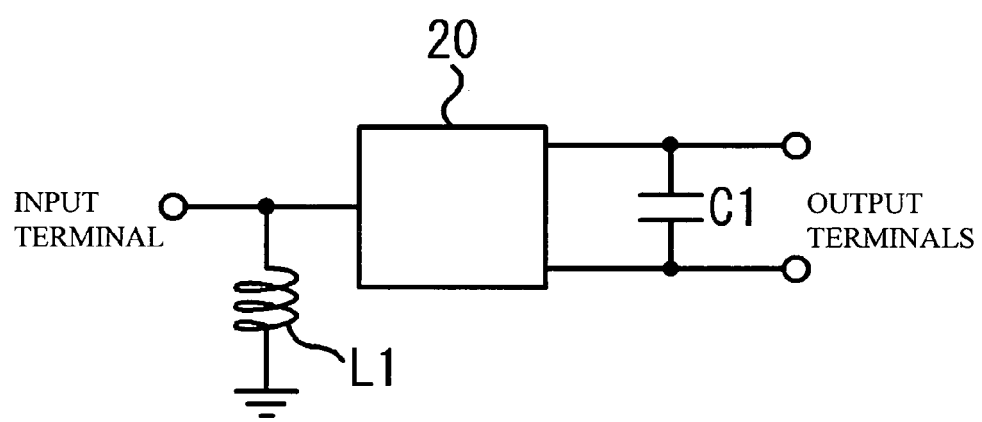
FIG. 15 illustrates the circuit structure of a SAW device in accordance with the second embodiment of the present invention.

As shown in FIGS. 14A through 14C, a predetermined electric part is formed on the principal surface of the base substrate 32 in accordance with this embodiment. The electric part may be a matching circuit that matches the impedances of the SAW element 20 and an external circuit with each other through conversion of the input impedance of the SAW element 20. In the structure shown in FIGS. 14A through 14C, a matching circuit that includes an inductor L1 and a capacitor C1 is formed. One end of the capacitor C1 is exposed through the bottom surface of the base substrate 32, with a via wire 6A piercing the silicon substrate 2a. FIG. 15 illustrates an example of the matching circuit. As shown in FIG. 15, the matching circuit of this embodiment has the inductor L1 formed on a wire that branches out from the input end and is grounded, and the capacitor C1 formed on a wire that connects the two output ends of the SAW element 20. With such a matching circuit, impedance matching can be performed between the SAW element 20 and an external circuit, and filter characteristics deterioration can be prevented. However, the electric part is not limited to the matching circuit shown in FIG. 15, and may be modified in various manners according to purposes and characteristics.

Also, the above electric part that is made of a metallic material such as copper (Cu), aluminum (Al), or gold (Au), can be produced by a sputtering technique or the like, at the same time as, or before or after the procedure for forming the electrode pads 5 and the layer 24 of the base substrate 32.

As described above, a SAW device having an electric part is produced in accordance with this embodiment. By doing so, a general-purpose SAW device with high performance can be obtained, without the need to use an external circuit. The other aspects of this embodiment are the same as those of the first embodiment, and therefore, explanation of them is omitted herein.

Third Embodiment

Figure 16A:
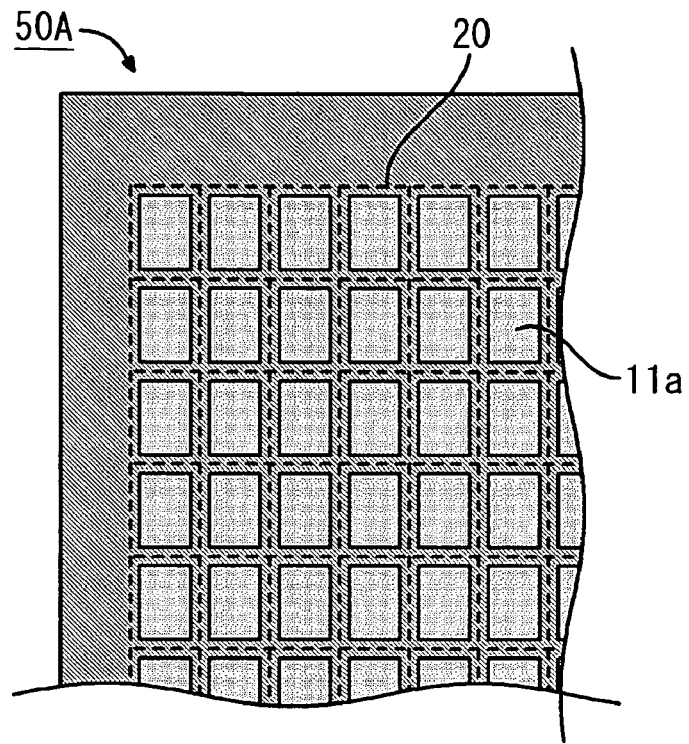
FIG. 16A is a top view of a substrate on which SAW elements each having the same structure as the SAW element shown in FIGS. 7A and 7B are two-dimensionally arranged.
Figure 16B:
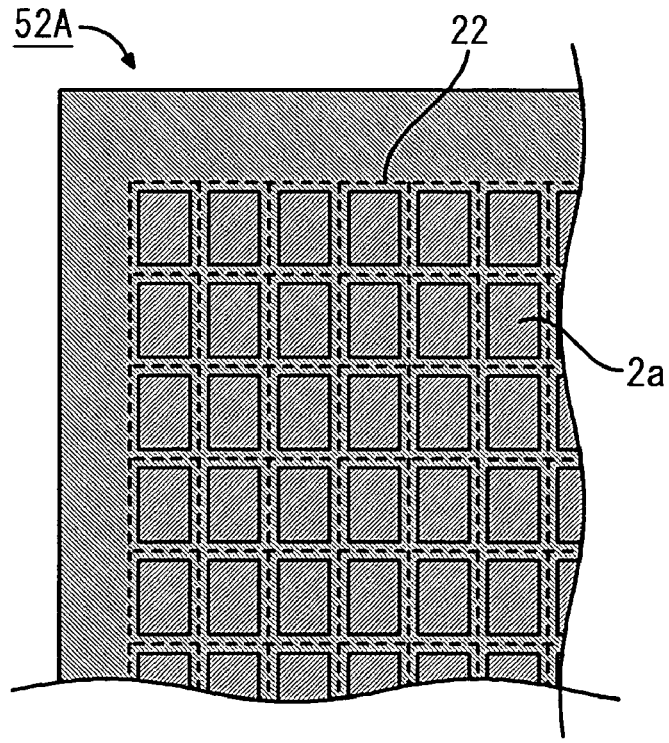
FIG. 16B is a top view of a substrate on which base substrates each having the same structure as the base substrate shown in FIGS. 8A through 8C are two-dimensionally arranged.

Referring now to FIGS. 16A and 16B, a third embodiment of the present invention will be described in detail. The SAW element 20 and the base substrate 22 (32) of each of the foregoing embodiments can be produced as pieces that are cut out from substrates 50A and 52A having multiple structures shown in FIGS. 16A and 16B, respectively. In FIGS. 16A and 16B, SAW elements 20 and base substrates 22 of the first embodiment are two-dimensionally arranged on the multiple substrates 50A and 52A, respectively.

The multiple substrates 50A and 52A are bonded to each other by the same technique as one of the techniques employed by the foregoing production methods, so that a number of SAW devices can be produced at once. Accordingly, the costs for producing SAW devices can be lowered, and less expensive SAW devices can be provided.

In the case where the multiple substrates 50A and 52A are employed, dicing grooves, as well as the vias 6a and 7a, are formed in the procedure equivalent to the procedure shown in FIG. 12F or FIG. 13G, so that dicing can be accurately and quickly performed to obtain individual SAW devices. The other aspects, production procedures, and effects in accordance with this embodiment are the same as those in accordance with any of the foregoing embodiments, and therefore, explanation of them is omitted herein.

Fourth Embodiment

Figure 17:
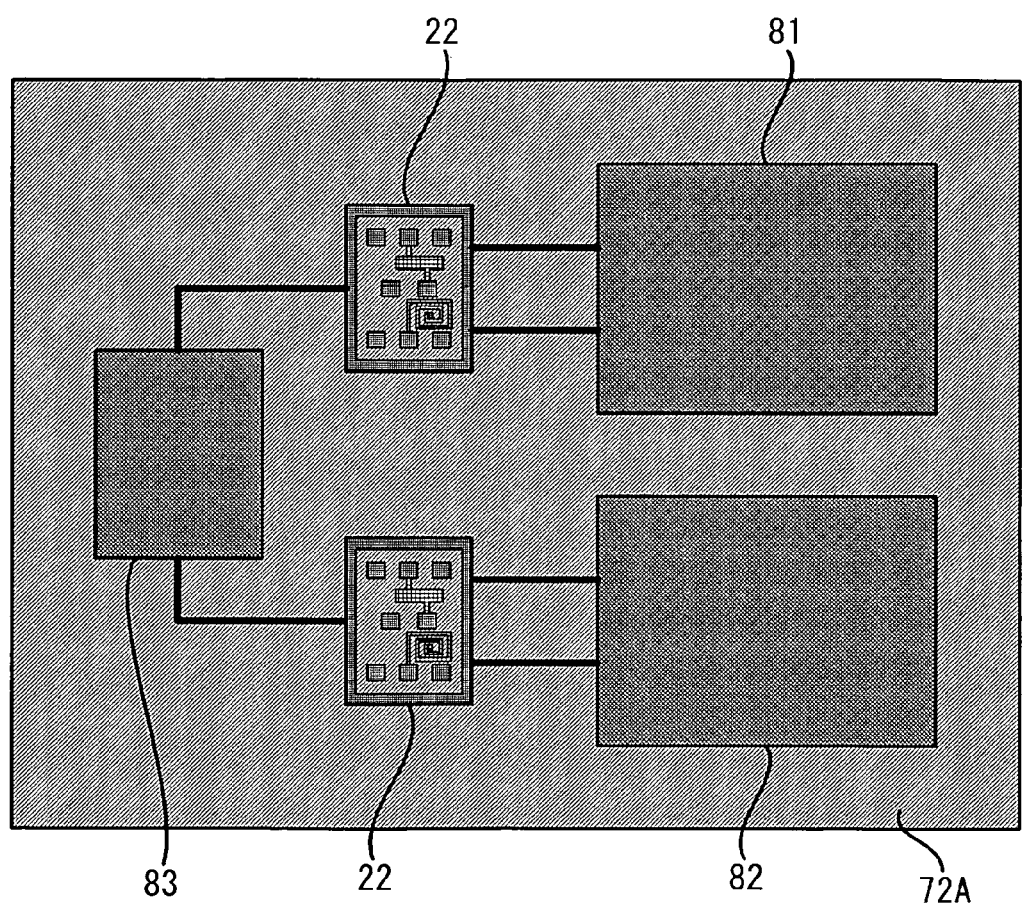
FIG. 17 is a top view of a low temperature co-fired ceramic (LTCC) in accordance with a fourth embodiment of the present invention.

Referring now to FIG. 17, a fourth embodiment of the present invention will be described in detail. In this embodiment, base substrates each having the same structure as the base substrate 22 or 32 are formed directly on a low temperature co-fired ceramic (LTCC) or a printed circuit board. FIG. 17 is a top view of a LTCC 72A on which base substrates each having the same structure as the base substrate 22 of the first embodiment are formed.

As shown in FIG. 17, a transmission circuit chip 81, a reception circuit chip 82, and a RF circuit 83 are mounted on the LTCC 72A. One base substrate 22 is formed on each of the transmission lines connecting the RF circuit 83 to the transmission circuit chip 81 and the reception circuit chip 82, so that a transmission filter and a reception filter are formed on the respective transmission lines. SAW elements 20 of the first embodiment are then joined to this LTCC 72A in this embodiment. Accordingly, the volume of each SAW device can be reduced. The other aspects, production procedures, and effects in accordance with this embodiment are the same as those in accordance with any of the foregoing embodiments, and therefore, explanation of them is omitted herein.

Fifth Embodiment

Figure 18A:
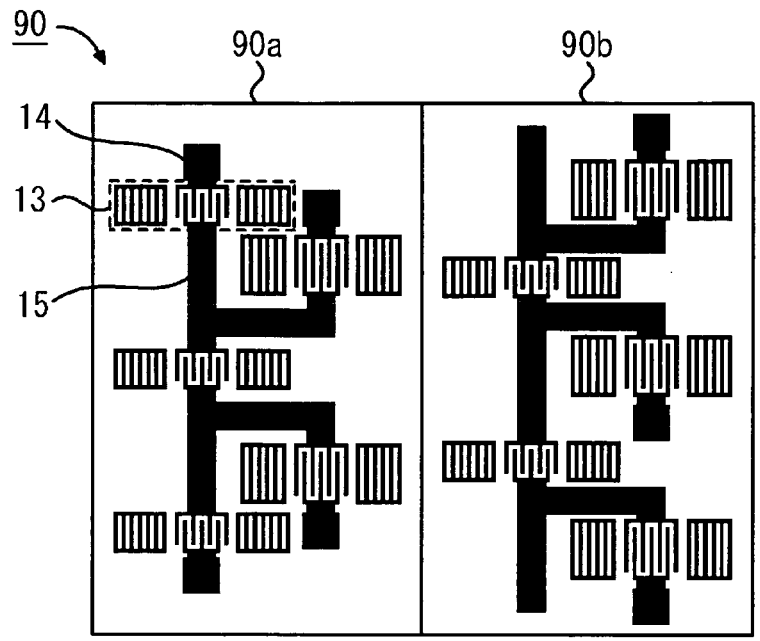
FIG. 18A is a top view of a duplexer in accordance with a fifth embodiment of the present invention.

In each of the foregoing embodiments, one filter is formed in one SAW element. However, the present invention is not limited to such a structure, and may be applied to a SAW filter that is formed as a duplexer 90 including a transmission filter 90a and a reception filter 90b, as shown in FIG. 18A.

Figure 18B:
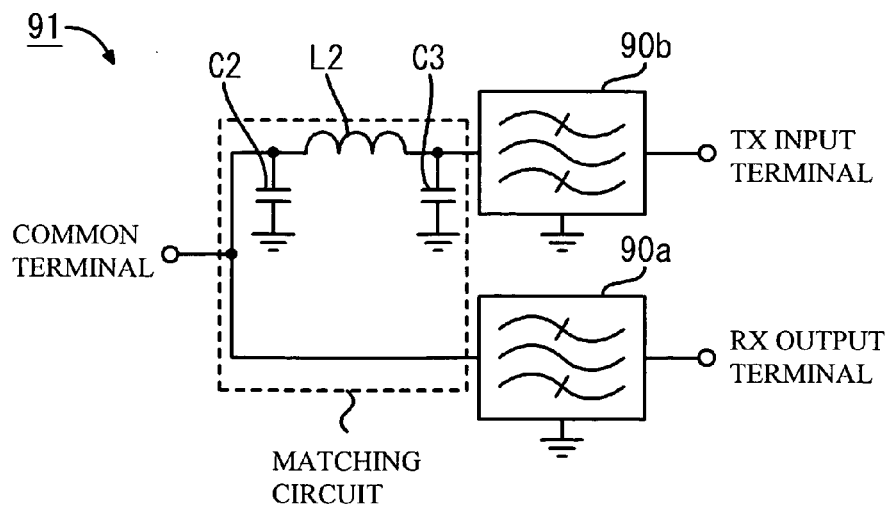
FIG. 18B illustrates the circuit structure of a SAW device that includes the duplexer of FIG. 18A.

Also, the circuit structure of a SAW device 91 shown in FIG. 18B includes the duplexer 90. As shown in FIG. 18B, a matching circuit having the same structure as the matching circuit of the second embodiment can be provided between the transmission filter 90a or the reception filter 90b and the input terminal that is a common terminal for the transmission filter 90a and the reception filter 90b. Alternatively, a matching circuit having the same structure as the matching circuit of the second embodiment can be provided between the input terminal and the transmission filter 90a, and between the input terminal and the reception filter 90b. Here, the matching circuit is formed as a low-pass filter that includes an inductor L2 and capacitors C2 and C3 sandwiching the inductor L2. If the resonant frequency of the transmission filter 90a is lower than the resonant frequency of the reception filter 90b while the transmission frequency is higher than the reception frequency, the low-pass filter should be connected to the higher frequency side. However, the matching circuit in this embodiment is not necessarily a low-pass filter.

Other Embodiments

Figure 19A:
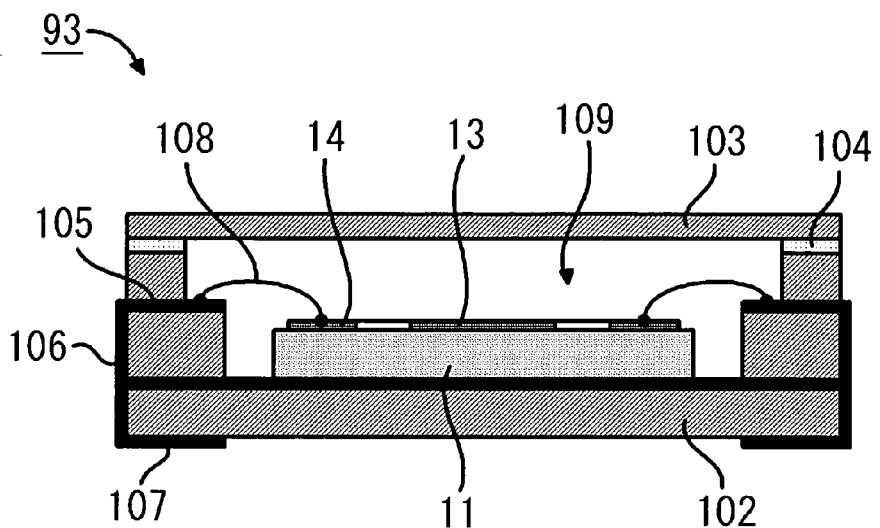
FIG. 19A is a section view of a wire-bonded SAW device in accordance with yet another embodiment of the present invention.
Figure 19B:
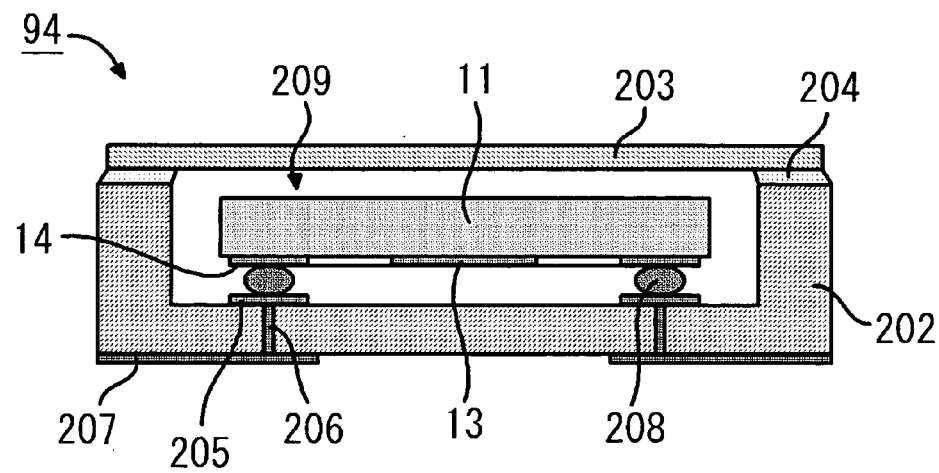
FIG. 19B is a section view of a flip-chip mounted SAW device in accordance with still another embodiment of the present invention.

In each of the foregoing embodiments, a base substrate is bonded to the surface of a SAW element on which the IDTs are formed, so that the cavity accommodating the IDTs can be hermetically sealed. However, the present invention is not limited to such a structure, and may be applied to a SAW device 93 shown in FIG. 19A. In the SAW device 93, the SAW element is bonded to a package 102 having a cavity 109 sealed with a metal cap 103. The bonding is carried out with wires 108. It is also possible to employ a SAW device 94 shown in FIG. 19B. In the SAW device 94, the SAW element in a face-down state is flip-chip mounted in the cavity 209 of a package 202.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A surface acoustic wave device comprising:
   interdigital transducers;
   first electrode pads that are connected to the interdigital transducers through wire patterns;
   a piezoelectric substrate on which the interdigital transducers, the first electrode pads, and the wire patterns, are formed, at least one of the first electrode pads not being connected to a ground pattern, and the piezoelectric substrate having a conductivity in the range of $10^{-12}/\Omega\cdot cm$ to $10^{-6}/\Omega\cdot cm$;
   a substrate on which second electrode pads to be connected to the first electrode pads are formed, wherein:
   the piezoelectric substrate has a first layer that surrounds at least the interdigital transducers and is made of a metal material identical to that of the first and second electrode pads;
   the substrate has a second layer that is formed in a region corresponding to the first layer, includes a through hole formed therein for an external connection and wherein the substrate for the second layer is made of said metal material; and
   the piezoelectric substrate and the substrate are bonded to each other by joining the first layer and the second layer to each other.

2. The surface acoustic wave device as claimed in claim 1, wherein the piezoelectric substrate contains lithium tantalate or lithium niobate as a main component.

3. The surface acoustic wave device as claimed in claim 1, wherein the joining surfaces of the first layer and the second layer are subjected to surface activation treatment.

* * * * *